(12) United States Patent
Nagao et al.

(10) Patent No.: US 7,212,082 B2
(45) Date of Patent: May 1, 2007

(54) METHOD OF MANUFACTURING PIEZOELECTRIC THIN FILM DEVICE AND PIEZOELECTRIC THIN FILM DEVICE

(75) Inventors: Keigo Nagao, Ube (JP); Tetsuro Kunisawa, Ube (JP); Tetsuo Yamada, Ube (JP)

(73) Assignee: UBE Industries, Ltd., Yamaguchi (JP)

( * ) Notice: Subject to any disclaimer, the term of this patent is extended or adjusted under 35 U.S.C. 154(b) by 134 days.

(21) Appl. No.: 10/538,137

(22) PCT Filed: Dec. 17, 2004

(86) PCT No.: PCT/JP2004/018890

§ 371 (c)(1),
(2), (4) Date: Jun. 9, 2005

(87) PCT Pub. No.: WO2005/060091

PCT Pub. Date: Jun. 30, 2005

(65) Prior Publication Data

US 2006/0033595 A1 Feb. 16, 2006

(30) Foreign Application Priority Data

Dec. 19, 2003 (JP) ............................. 2003-422211

(51) Int. Cl.
*H03H 9/15* (2006.01)
*H03H 3/02* (2006.01)
*H03H 9/54* (2006.01)
(52) U.S. Cl. ...................................... 333/187; 310/324
(58) Field of Classification Search ................. 333/187
See application file for complete search history.

(56) References Cited

U.S. PATENT DOCUMENTS

| | | | |
|---|---|---|---|
| 4,642,508 A | * | 2/1987 | Suzuki et al. ............... 310/321 |
| 6,842,088 B2 | * | 1/2005 | Yamada et al. ............. 333/187 |
| 2002/0190814 A1 | * | 12/2002 | Yamada et al. ............. 333/187 |

FOREIGN PATENT DOCUMENTS

| | | |
|---|---|---|
| JP | 5-8153412 A | 9/1983 |
| JP | 6-0142607 A | 7/1985 |
| JP | 8-330533 A | 12/1996 |

(Continued)

*Primary Examiner*—Barbara Summons
(74) *Attorney, Agent, or Firm*—Frommer Lawrence & Haug LLP; Ronald R. Santucci

(57) ABSTRACT

Method of producing a piezoelectric thin film device comprises a step of forming an insulating layer (12) capable of being etched by a specific chemical substance on the upper surface of a substrate (11); a step of forming a sacrificial layer (13) made of a substance having a higher etching rate by the specific chemical substance than the insulating layer on a partial region of the insulating layer; a step of forming a lower electrode (15) on a region including the sacrificial layer; a step of forming the piezoelectric thin film (16) on a region including a part of the lower electrode; a step of forming an upper electrode (17) on a region including a part of the piezoelectric thin film; a step of forming via hole (18), which penetrates the piezoelectric thin film and lower electrode, so as to expose a part of the sacrificial layer; and a step of forming a space (20) for oscillation by etching both the sacrificial layer and the insulating layer with the same specific chemical substance by introducing the specific chemical substance through the via hole.

15 Claims, 5 Drawing Sheets

FOREIGN PATENT DOCUMENTS

| | | |
|---|---|---|
| JP | 2000-069594 A | 3/2000 |
| JP | 2002-372974 A | 12/2002 |
| JP | 2003-032060 A | 1/2003 |
| JP | 2003-136499 A | 5/2003 |
| WO | WO 98/16956 A | 4/1998 |
| WO | WO 02/093549 A | 11/2002 |

* cited by examiner

METHOD OF MANUFACTURING PIEZOELECTRIC THIN FILM DEVICE AND PIEZOELECTRIC THIN FILM DEVICE

This application is a 371 of PCT/JP2004/018890 filed on Dec. 17, 2004 and claims priority benefits from Japanese Patent Application Number 2003-422211 filed Dec. 19, 2003.

TECHNICAL FIELD

The present invention relates to a method of producing a piezoelectric thin film device produced by combining single or a plurality of piezoelectric thin film resonators using a piezoelectric thin film, and more particularly to a method of producing piezoelectric thin film device used for a filter for communication equipment, or the like, and a piezoelectric thin film device produced by the same.

BACKGROUND ART

Devices using a piezoelectric phenomenon have been used in various fields. In the progress of miniaturization and power saving of portable equipment, the application field of surface acoustic wave (SAW) devices as RF filters or IF filters used for the above equipment is being enlarged. Enhancement of the design and producing technologies of SAW filters have satisfied user's strict requirements to specifications. However, as the frequencies being used are shifted to a higher frequency band, the enhancement of the characteristics is approaching to its upper limit, so that great technical innovation has been required for both of the microstructure of electrodes to be formed and securement of stable output.

Further, a thin film bulk acoustic resonator (hereinafter referred to as "FBAR"), and stacked thin film bulk acoustic resonators and filters (hereinafter referred to as "SBAR") using the thickness vibration of piezoelectric thin film are each constituted of a thin film mainly composed of piezoelectric element and electrodes for driving the thin film on a thin support film provided on a substrate so that they can perform fundamental resonance in gigahertz band. When a filter is constructed by FBAR or SBAR, the filter can be formed in a remarkably compact size, and also it can be operated with low loss and in a broad band. In addition, it can be manufactured integrally with a semiconductor integrated circuit. Therefore, it is expected that FBAR and SBAR will be applied to future ultraminiature portable equipments.

A piezoelectric thin film resonator such as FBAR or SBAR applied to a resonator, a filter, or the like, using such elastic wave is produced as follows.

By using various thin film forming methods, a base film comprising a dielectric thin film, a conductive thin film or a stacked film of the dielectric thin film and the conductive thin film is formed on the surface of a single crystal semiconductor substrate of silicon or the like, on the surface of a substrate constructed by forming polycrystalline diamond film on silicon wafer, or on the surface of a substrate of constant modulus metal such as elinvar or the like. Further, a piezoelectric thin film is formed on the base film, and a desired upper structure is formed. After each film is formed or after all the films are formed, each film is subjected to physical processing or chemical processing to perform micro-fabrication and patterning. After a portion of the substrate located below the oscillation portion is removed by anisotropic etching based on a wet process to form a suspended structure, the resultant product is separated every device to obtain piezoelectric thin film resonators.

For example, one of methods of producing a piezoelectric thin film resonator known heretofore is a method for forming a via hole by forming a base film, a lower electrode, a piezoelectric thin film and an upper electrode on an upper surface of the substrate, and then removing a substrate portion under a portion which will act as an oscillating portion from a lower surface side of the substrate (for example, refer to Pat. Document 1: JP(A)-58-153412 and Pat. Document 2: JP(A)-60-142607). If the substrate is made of silicon, a part of the silicon substrate is etched away from the backside thereof by using a heated KOH water solution, thereby forming via hole. Thus, there can be produced a resonator having such shape that the edge of the structure in which a piezoelectric thin film is sandwiched between a plurality of metal electrodes is supported at the front surface side of the silicon substrate by the silicon substrate at a portion surrounding the via hole.

However, since etching is advanced in parallel with a (111) plane if wet etching using alkali such as KOH, etc. is performed, the etching is advanced obliquely at inclination angle of 54.7° with respect to the front surface of the (100) silicon substrate, and a distance between the adjacent resonators must be set remarkably far. For example, a device having a planar size of about 150 μm×150 μm and constructed on a silicon wafer having a thickness of 550 μm needs a backside etching hole of about 930 μm×930 μm, and a distance between centers of the adjacent resonators becomes 930 μm or more. This disturbs the integration of the piezoelectric thin film resonators. Further, a metal electrode for connecting the adjacent piezoelectric thin film resonators becomes long, and also its electric resistance increases. Therefore, an insertion loss of the piezoelectric thin film device produced by combining a plurality of the piezoelectric thin film resonators becomes remarkably large. A large via hole of an opening size of 930 μm is not only easy to be damaged, but also an acquired quantity of the final product, that is, a yield of the piezoelectric thin film device on the substrate is limited, and a region of about 1/15 of the substrate can be used for a device production. On the other hand, it is considered to form a large via hole bridging over a plurality of resonators. However, the via hole is further increased in size, a strength of the device is remarkably reduced, and the resonators are further easy to be damaged.

A second method of conventional art for producing a piezoelectric thin film resonator such as FBAR, SBAR, etc. applied to the piezoelectric thin film device is to form an air bridge type FBAR device (for example, refer to Pat. Document 3: JP(A)-2000-69594, Pat. Document 4: JP(A)-2002-509644 and Pat. Document 5: JP(A)-2003-32060). Normally, a sacrificial layer is formed, and then a piezoelectric thin film resonator is produced on this sacrificial layer. The sacrificial layer is removed at the end or near the end of the process, and a space for the oscillation is formed. Since the overall processing is executed on an upper surface side of the substrate, this method does not need an alignment of a pattern on both the surfaces of the substrate and an opening of a large area at the lower surface side of the substrate.

The Pat. Document 3 describes a construction of an air bridge type FBAR/SBAR device, and a method of producing it using a phospho-silicate glass (PSG) as a sacrificial layer.

However, this method requires long and complicated steps. That is, in this method, after a series of steps of forming a cavity on an upper surface of a substrate by etching, depositing a sacrificial layer on an upper surface side of the substrate by a thermal CVD (Chemical Vapor Deposition) method, planarization and smoothing of the upper surface of the substrate by a CMP (Chemical Mechanical Polishing) method, and depositing and forming a lower electrode, a piezoelectric element and an upper electrode on the sacrificial layer, a via hole penetrating to the sacrificial layer is opened, a piezoelectric laminated structure formed on the upper surface side of the substrate is protected with a resist or the like, and the sacrificial layer is removed from the cavity by permeating an etchant through the via hole. In addition, the number of masks used for forming the pattern is remarkably increased. Since the manufacturing steps are long and complicated, the method itself increases the cost of the device as well as reduces a yield of the product, and further the device becomes highly costly.

The Pat. Document 4 describes a construction of an air bridge type FBAR/SBAR device, and a method of producing it. In this method, a metal or a polymer is used as sacrificial layer, and a space for oscillation is formed in a relatively simple process without the steps of forming a cavity on an upper surface of a substrate and planarization of the upper surface of the substrate by CMP.

However, in order to form the space for oscillation excellently without contact of the piezoelectric laminated structure having a size of about 150 μm×150 μm with the substrate, the thickness of the sacrificial layer needs about 2000 nm. When a metal of 2000 nm is deposited, the surface roughness of the sacrificial layer is deteriorated by a growth of particle of metal crystal. When the piezoelectric laminated structure is formed on this sacrificial layer, a decrease in an electromechanical coupling factor $Kt^2$ associated with a decrease in a crystal orientation of the piezoelectric thin film itself, and a decrease in a resonant sharpness Q associated with an increase in a surface roughness of the piezoelectric laminated structure itself, occur, and production of the piezoelectric thin film device having good characteristics becomes difficult. It is described that a polymer is used as the sacrificial layer, but in order to form the piezoelectric thin film having good crystal orientation, it is normally necessary to deposit the piezoelectric thin film at a temperature of 300° C. or higher in high vacuum. Thus, there is a problem in stability of the polymer. Further, since a bend of 2000 nm arises at ends of the piezoelectric laminated structure, there is a severe problem of remarkable deterioration of reliability by cracking or a decrease in strength of the piezoelectric thin film.

In the Pat. Document 5, it is described that a construction of an air bridge type FBAR/SBAR device, and a method of producing it. This method does not require steps of forming a cavity on an upper surface of a substrate and planarization the upper surface of the substrate by the CMP and can reduce a bend at ends of a piezoelectric laminated structure.

However, in this method, the sacrificial layer is etched in advance with a first etchant, and further a second etchant is introduced by using the resultant gap to etch a supporting film. Thus, a space for oscillation is formed. Accordingly, it is necessary to form the device with use of a material durable to two types of etchants, which restricts the material to be used and which makes the process complex, thereby increasing the production cost. Further, as the sacrificial layer, substances such as a magnesium oxide, a zinc oxide, etc., are used. When these substances form a film by a vapor-depositing method, etc., the surface roughness of the sacrificial layer is large, and crystal orientation of the lower electrode and the piezoelectric thin film formed on the sacrificial layer is deteriorated. For example, in the case of the magnesium oxide thin film having a thickness of 50 nm, its surface roughness (RMS variation in height) becomes normally 10 nm or more.

Since FBAR and SBAR obtain a resonance by propagation of elastic wave generated by a piezoelectric effect of a piezoelectric element in the piezoelectric laminated structure, the characteristics of the device are greatly affected by a crystal quality of a lower electrode, a piezoelectric thin film, an upper electrode, or the like on the substrate as well as an accuracy of forming a space for oscillation. Further, when the bend of the piezoelectric thin film is large, the strength of the piezoelectric thin film decreases, and reliability remarkably decreases. Therefore, it becomes remarkably difficult to stably obtain the piezoelectric thin film device having excellent characteristics and high reliability.

By such a reason, a piezoelectric thin film device which performs sufficient performance in gigahertz band has not been obtained. Therefore, establishment of a method of producing a piezoelectric thin film device having excellent characteristics and high reliability with a simple process and realization of the piezoelectric thin film device produced by the method are strongly desired.

DISCLOSURE OF THE INVENTION

The present invention is made in view of the above-mentioned problems, and an object of the present invention is to provide a method of producing a piezoelectric thin film device having excellent characteristics and high reliability, which is capable of forming a space for oscillation excellently under a piezoelectric laminated structure with a simple process, and a piezoelectric thin film device produced by this method.

As a result of the intent study on the method of forming a space for oscillation in order to solve the above problems, the inventors have been found that it is a means for most preferably solving the problems for both the performance increase and cost reduction of the piezoelectric thin film device, to form a space for oscillation by previously forming an insulating layer capable of being etched by a specific chemical substance on a substrate, forming a sacrificial layer made of a substance having a higher etching rate by the specific chemical substance used as etchant than the insulating layer on a region to form the space for oscillation, removing by etching the sacrificial layer and corresponding region of the insulating layer provided under the sacrificial layer by using the specific chemical substance as the etchant.

That is, according to the present invention, the above described object is achieved by providing a method of producing a piezoelectric thin film device in which a piezoelectric laminated structure including a piezoelectric thin film, an upper electrode and a lower electrode formed on the upper and lower surfaces of the film, respectively, is supported by a substrate, and in which a space for oscillation is formed to allow the oscillation of the piezoelectric laminated structure, the method being characterized by comprising: a step of forming an insulating layer capable of being etched by a specific chemical substance on the upper surface of the substrate; a step of forming a sacrificial layer made of a substance having a higher etching rate by the specific chemical substance than the insulating layer on a partial region of the insulating layer; a step of forming a lower electrode on a region including a part or entirety of the sacrificial layer; a step of forming the piezoelectric thin film on a region including a part of the lower electrode; a step of forming an upper electrode on a region including a part of the piezoelectric thin film; a step of forming via hole so as to expose a part of the sacrificial layer or a part of the insulating layer provided under the sacrificial layer; and a step of forming the space for oscillation by etching both the sacrificial layer and the insulating layer provided under the sacrificial layer with the same specific chemical substance by introducing the specific chemical substance through the via hole.

In one aspect of the present invention, the via hole is formed to penetrate at least one of the lower electrode, the piezoelectric thin film and the upper electrode to expose a part of the sacrificial layer.

In one aspect of the present invention, the via hole is formed to penetrate the substrate to expose a portion of the insulating layer.

In one aspect of the present invention, material of the insulating layer contains a silica glass or a silicate glass as a main component, and material of the sacrificial layer is titanium.

In one aspect of the present invention, the material of the insulating layer is aluminum nitride, and material of the sacrificial layer is aluminum.

In one aspect of the present invention, the method of producing a piezoelectric thin film device comprises a step of, after forming the sacrificial layer, laminating a second insulating layer made of a substance having a smaller etching rate by the specific chemical substance than the insulating layer on the sacrificial layer and the insulating layer.

In one aspect of the present invention, material of the second insulating layer is a nitride or oxynitride insulator containing aluminum nitride or silicon nitride as a main component.

In one aspect of the present invention, a thickness of the sacrificial layer is 20 nm to 600 nm, preferably 20 nm to 90 nm.

In one aspect of the present invention, a surface roughness of the upper surface of the sacrificial layer is 5 nm or less by RMS variation in height.

In one aspect of the present invention, a thickness of the insulating layer is 500 nm to 3000 nm.

Further, according to the present invention, the above described object is achieved by providing a piezoelectric thin film device in which a piezoelectric laminated structure including a piezoelectric thin film, an upper electrode and a lower electrode formed on the upper and lower surfaces of the film, respectively, is supported by a substrate via an insulating layer, and in which a space for oscillation is formed to allow the oscillation of the piezoelectric laminated structure, the device being characterized in that a surface roughness of a lower surface of the lower electrode is 5 nm or less by RMS variation in height, and an upper surface of the insulating layer is disposed lower than the lower surface of the lower electrode in the space for oscillation and positioned above a lower surface of the space for oscillation.

In one aspect of the present invention, an interval between the upper surface of the insulating layer and the lower surface of the lower electrode in the space for oscillation is 20 nm to 600 nm, preferably 20 nm to 90 nm. Further, in one aspect of the present invention, an interval between the upper surface of the insulating layer and the lower surface of the space for oscillation is 500 nm to 3000 nm.

As described above, by combining the insulating layer capable of being etched by the specific chemical substance and the sacrificial layer having a higher etching rate than the insulating layer by the specific chemical substance, the space for oscillation can be formed excellently under the piezoelectric laminated structure by a simple process without using a polishing technology such as a CMP, etc., and the piezoelectric thin film device having excellent characteristics and high reliability can be produced stably. Further, since the piezoelectric thin film device of the present invention has an excellent space for oscillation under the piezoelectric laminated structure, the characteristics are excellent and the reliability is high. Therefore, it is suitable to produce a piezoelectric thin film device such as a filter, a duplexer, etc., by combining the piezoelectric laminated structure having the obtained oscillation space.

BEST MODE FOR CARRYING OUT THE INVENTION

Embodiments of the present invention will be described in detail.

Figure 1:
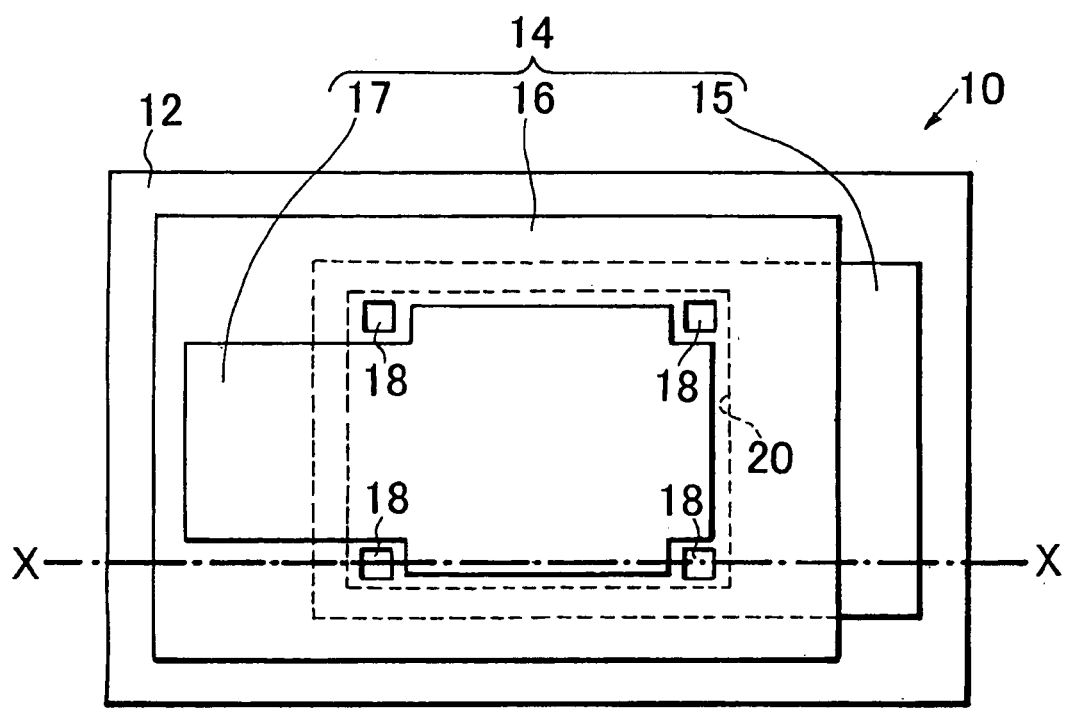
FIG. 1 is a schematic plan view showing an embodiment of a piezoelectric thin film device (piezoelectric thin film resonator 10) according to the present invention.
Figure 2:
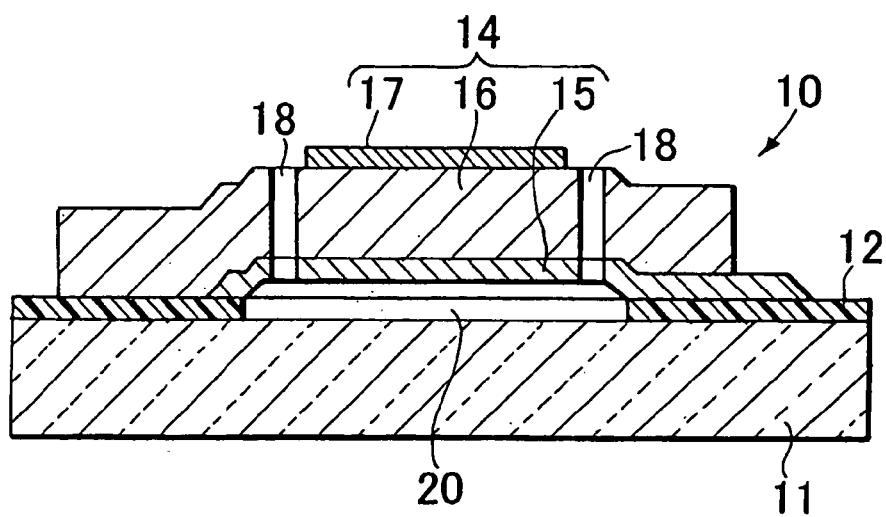
FIG. 2 is a sectional view taken along a line X—X of FIG. 1.

FIG. 1 is a schematic plan view showing a first embodiment of a piezoelectric thin film device (piezoelectric thin film resonator 10) according to the present invention, and FIG. 2 is a sectional view taken along a line X—X of FIG. 1. In the description of the present invention, upward and downward directions show upward and downward directions of the drawing when the piezoelectric thin film device is disposed as shown in FIG. 2. Therefore, expressions of an upper surface, a lower surface, etc. accords with these directions.

In these drawings, a piezoelectric thin film resonator 10 has a substrate 11, an insulating layer 12 formed on the upper surface of the substrate 11, and a piezoelectric laminated structure 14 formed to bridge a space 20 for oscillation formed by removing a part of the insulating layer. The piezoelectric laminated structure 14 includes a lower electrode 15, a piezoelectric thin film 16 formed to cover a part of the lower electrode 15 and an upper electrode 17 formed on the piezoelectric thin film 16.

Then, a method of producing the first embodiment shown in these drawings will be described. FIGS. 3A to 3E are explanatory views showing a series of manufacturing steps of the first embodiment in a cross section along a line X—X similar to FIG. 2.

Figure 3A:
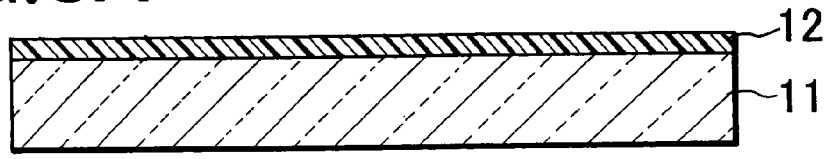
FIGS. 3A to 3E are explanatory views in cross section showing a series of manufacturing steps of the piezoelectric thin film device of FIGS. 1 and 2.
Figure 3B:
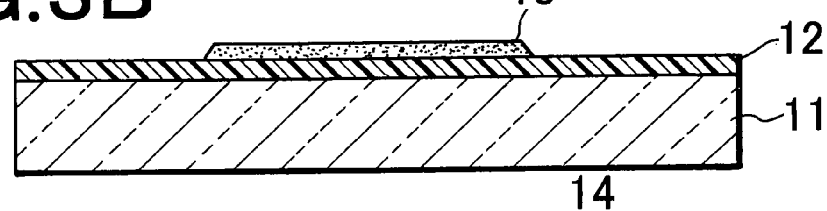
Figure 3C:
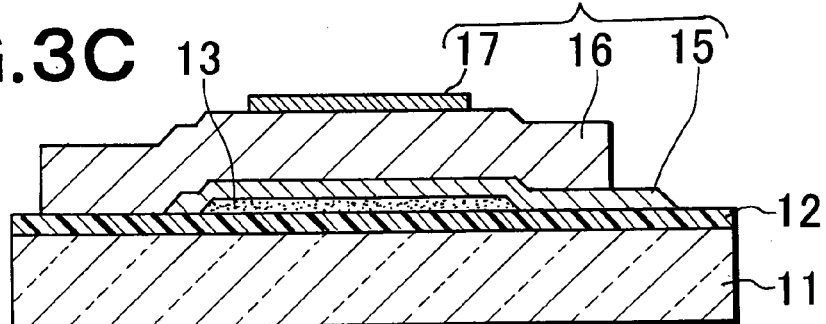
Figure 3D:
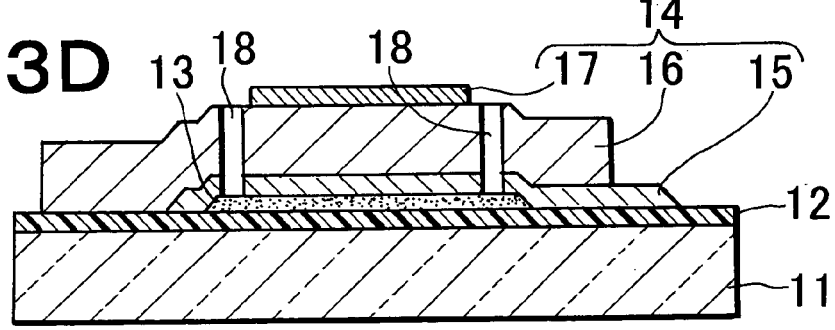
Figure 3E:
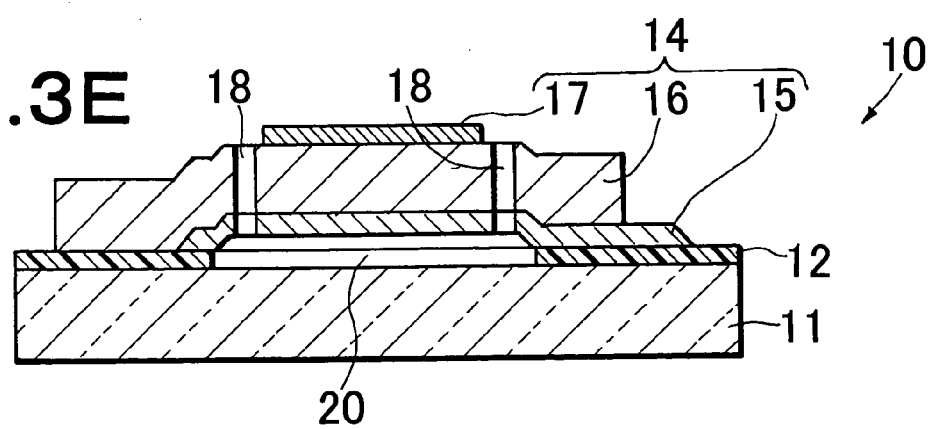

In this embodiment, first as shown in FIG. 3A, the insulating layer 12 is formed on the substrate 11. Then, as shown in FIG. 3B, a sacrificial layer 13 having a higher etching rate by a certain specific chemical substance than the insulating layer 12 is formed on a region corresponding to the space 20 for oscillation on the insulating layer 12. Subsequently, as shown in FIG. 3C, the piezoelectric laminated structure 14 having the lower electrode 15, the piezoelectric thin film 16 and the upper electrode 17 is formed on the sacrificial layer 13 and the insulating layer 12. Then, as shown in FIG. 3D, a via hole 18 is formed to expose a part of the sacrificial layer 13 through the piezoelectric thin film 16 and the lower electrode 15. Then, as shown in FIG. 3E, an etchant (the specific chemical substance) for etching the sacrificial layer and the insulating layer is introduced through the via hole. Since the sacrificial layer 13 is selected from substances having a higher etching rate than the insulating layer 12, the sacrificial layer 13 is etched quicker than the insulating layer 12, and the etchant is introduced excellently into the gap formed by the etching. Although the etching itself is isotropic, the etchant is introduced in a planar manner to the gap where the sacrificial layer 13 is removed. Thus, the insulating layer 12 is etched mainly in the thickness direction thereof, and a portion of the insulating layer 12 located below the sacrificial layer 13 is excellently removed by etching. Since the etching is isotropic, the portion of the insulating layer 12 disposed corresponding to the end of the sacrificial layer 13 is also etched in the lateral direction. The amount of side etching is about the thickness of the insulating layer 12, and therefore the space 20 for oscillation is limited substantially to the portion where the sacrificial layer 13 has been removed and the portion of the insulating layer disposed thereunder has been removed. Thus, in the present invention, the sacrificial layer and the insulating layer are etched by the same etchant (specific chemical substance).

As the substrate 11, a single crystal wafer such as Si (100), or an SOI (Silicon on Insulator) wafer can be used. A semiconductor single crystal wafer of gallium arsenide, etc. or an insulator substrate of a quartz glass etc. can be used.

As the insulating layer 12, for example, an insulator film containing a silica glass ($SiO_2$) as a main component, or an aluminum nitride (AlN) as a main component can be used. Here, the main component designates a component having a content of 50 equivalent % or more. As a method of forming the insulator film containing the silica glass as a main component, when a silicon wafer is used as the substrate, formation of a thermal oxide film by a thermal oxidation method is first listed. The surface roughness of the silicon wafer is 0.3 nm or less by RMS variation in height. Since the thermal oxide film is formed directly by the oxidation of the silicon wafer, the surface roughness thereof is about the same degree as that of the silicon wafer. As compared with a method of depositing the sacrificial layer in advance and planarization by a CMP technology, it is preferred since the surface roughness of the piezoelectric laminated structure can be reduced. In addition to the thermal oxide film, a silica glass, a phosphosilicate glass (PSG), a borosilicate glass (BSG), a borophosphosilicate glass (BPSG), etc. deposited by a CVD (Chemical Vapor Deposition) method are selected. The aluminum nitride (AlN) film can be formed, for example, by a sputtering method. When the aluminum nitride film is used as the piezoelectric thin film, the use of the aluminum nitride film as the insulating layer is convenient since the same deposition system can be used.

When the insulating layer is constructed by an insulating material which contains aluminum nitride or silicon nitride of high elastic modulus as main components, an electromechanical coupling factor of the piezoelectric laminated structure formed thereon increases, and the pass band width of the obtained piezoelectric thin film device can be increased by step roll off. Further, a resonant sharpness, a Q value becomes high, and an attenuation quantity of the obtained piezoelectric thin film device can be increased. Furthermore, the insulating layer 12 may be made of a single layer, or made of a plurality of layers in which a layer for enhancing the adhesiveness and a protective layer for preventing the component of the original insulating layer to be diffused to the substrate side are included. The thickness of the insulating layer 12 is preferably about 500 nm to 3000 nm. When the thickness becomes thinner than 500 nm, a part of the insulating layer is brought into contact with the substrate by the deflection of the piezoelectric laminated structure, and the possibility of inducing adverse influence on the characteristics is remarkably increased. When the thickness exceeds 3000 nm, a time for etching to form the space for oscillation is lengthened, etching in the lateral direction of the insulating layer portion corresponding to the end of the sacrificial layer is advanced, and the dimensional accuracy of the space for oscillation is decreased. Accordingly, adverse influence is exerted on the characteristics, and the yield of the piezoelectric laminated structure is deteriorated by the exfoliation of the lower electrode.

The sacrificial layer 13 is selected from substances having a higher etching rate by a certain specific chemical substance than the insulating layer 12. When an insulating layer containing a silica glass or a silicate glass as a main component is used as the insulating layer 12, a titanium (Ti) is suitably used as the material of the sacrificial layer 13. As the silicate glass, a phosphosilicate glass (PSG), a borosilicate glass (BSG), and a borophosphosilicate glass (BPSG) can be exemplified. In this case, as the etchant, a hydrofluoric acid or a hydrofluoric acid buffer solution can be used. The titanium (Ti) has an etching rate of several times as high as the silica glass to these etchants. Therefore, the lateral expansion of the etching on the insulating layer disposed corresponding to the end of the sacrificial layer can be reduced, and a shape and dimension of the space for oscillation can be controlled accurately. As the other material of the sacrificial layer when the insulating layer containing the silica glass as a main component is used, germanium (Ge) can be used. In this case, as the etchant, a mixed solution of the hydrofluoric acid and the hydrogen peroxide solution can be suitably used. Further, when aluminum nitride is used as the material of the insulating layer 12, aluminum can be suitably used as the material of the sacrificial layer 13. As the etchant of this case, heated phosphoric acid, etc., may be used. Further, the sacrificial layer 13 may be a layer of a single material, or may be two or more layers when a layer made of a substance having a high etching rate is used for the lowermost layer contacting the insulating layer 12. Since the characteristics of the piezoelectric thin film resonator are affected largely by a crystal quality and orientation of the piezoelectric thin film, it is preferable to raise the crystal quality and orientation of the lower electrode 15 and the piezoelectric thin film 16 by suitably selecting the material of the respective layers of the sacrificial layer. The thickness of the sacrificial layer 13 is 20 to 600 nm, preferably 20 to 90 nm. If the thickness is thinner than 20 nm, permeance of the etchant is slow. It takes a long time to etch the insulating layer, and the etching in the lateral direction on the insulating layer disposed corresponding to the end of the sacrificial layer is advanced. Thus, dimensional accuracy of the space for oscillation is reduced. When the thickness becomes 90 nm or more, the resonance characteristics of the obtained piezoelectric thin film device tends to slightly decrease. Further, if the thickness exceeds 600 nm, the time required to form the space for oscillation is shortened, and processing accuracy is improved. However, since the degree of bend of the end of the piezoelectric laminated structure increases, the occurrence of the crack of the piezoelectric thin film tends to be involved, and the reliability is lowered. As a method for patterning the sacrificial layer 13 in a predetermined shape, a photolithographic technology such as dry etching, wet etching, etc., and a lift-off method can be suitably used.

The lower electrode 15 is constructed by a metal layer formed by a sputtering method or a vapor-depositing method, or a laminate of such a metal layer and an adhesive metal layer formed between the metal layer and the insulating layer 12 or the sacrificial layer 13 as needed. The thickness of the lower electrode 15 is, for example, 50 to 500 nm. As the material of the lower electrode 15, it is not particularly limited, but gold (Au), platinum (Pt), titanium (Ti), aluminum (Al), molybdenum (Mo), tungsten (W), iridium (Ir), ruthenium (Ru), etc. are suitably used. However, it is necessary to appropriately select the material so as not to induce adverse influence on resistance to the etchant and a crystal quality and orientation of the piezoelectric thin film, when the sacrificial layer made of a single material is used. As a method for patterning in a predetermined shape, a photolithographic technology such as dry etching, wet etching, etc., and a lift-off method can be suitably used.

As the material of the piezoelectric thin film 16, aluminum nitride (AlN), zinc oxide (ZnO), cadmium sulfide (CdS), lead titanate (PT($PbTiO_3$)), lead zirconate-titanate (PZT($Pb(Zr, Ti)O_3$)), etc. are used. Particularly, the AlN has a fast propagation speed of elastic wave, and is suitable as a piezoelectric thin film for a piezoelectric thin film device such as a piezoelectric thin film resonator, a piezoelectric thin film filter, etc. operating in a high frequency band. The thickness is, for example, 500 to 3000 nm. As a method for patterning in a predetermined shape, a photolithographic technology such as dry etching, wet etching, etc. can be suitably used.

As the upper electrode 17, a metal layer formed by a sputtering method, a vapor-depositing method, etc. is used similarly to the lower electrode 15. As the material of the upper electrode 17, gold (Au), platinum (Pt), titanium (Ti), aluminum (Al), molybdenum (Mo), tungsten (W), tantalum (Ta), iridium (Ir), ruthenium (Ru), etc. are suitably used. From the reasons that adhesiveness is raised, etc., an adhesive metal layer disposed between the metal layer and the piezoelectric thin film 16 can be added as needed. The thickness of the upper electrode 17 is, for example, 50 to 500 nm including the adhesive metal layer. As a method for patterning in a predetermined shape, a photolithographic technology such as dry etching, wet etching, etc., and a lift-off method are suitably used.

The via hole 18 exposes a part of the sacrificial layer 13, and is provided so that etchant is excellently introduced therethrough. In this embodiment, the via holes 18 are disposed at four corners of the sacrificial layer 13, but the present invention is not particularly limited to this. As a method for forming the via hole of the desired shape, a photolithographic technology such as dry etching, wet etching, etc. can be suitably used.

The formation of the space 20 for oscillation is performed by introducing the etchant through the via hole 18, and removing by etching the sacrificial layer 13 and the insulating layer 12 disposed under the sacrificial layer 13. It is necessary to protect the portion except the via hole 18 by a photoresist depending on the type of the etchant and the material of the piezoelectric laminated structure 14. As the photoresist, a novolac or cyclized rubber, etc., can be suitably used according to the material of the etchant.

Figure 4:
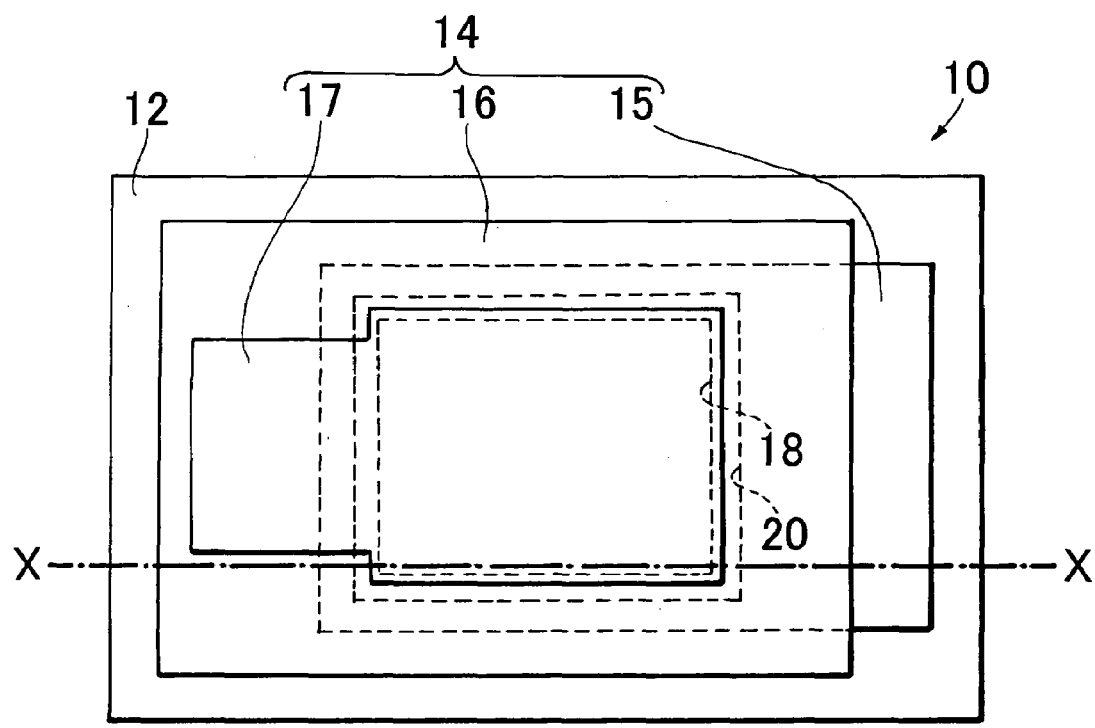
FIG. 4 is a schematic plan view showing another embodiment of the piezoelectric thin film device (piezoelectric thin film resonator 10) according to the present invention.
Figure 5:
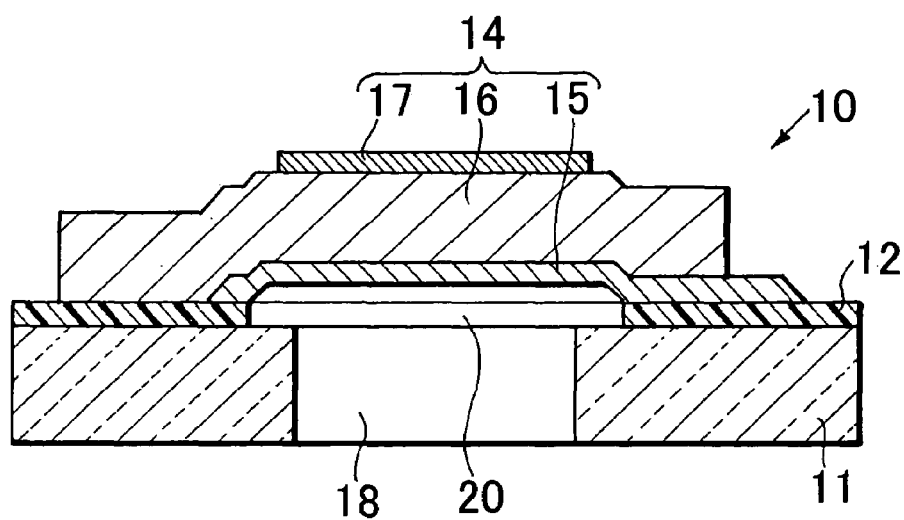
FIG. 5 is a sectional view taken along a line X—X of FIG. 4.
Figure 6A:
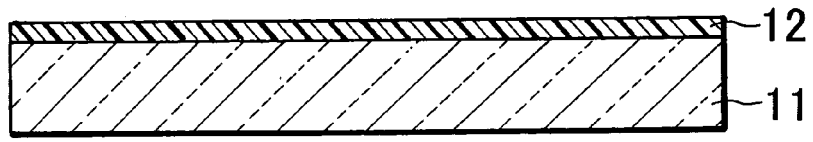
FIGS. 6A to 6E are explanatory views in cross section showing a series of manufacturing steps of the piezoelectric thin film device of FIGS. 4 and 5.
Figure 6B:
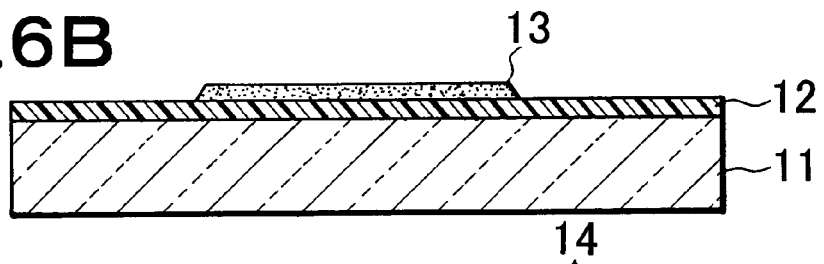
Figure 6C:
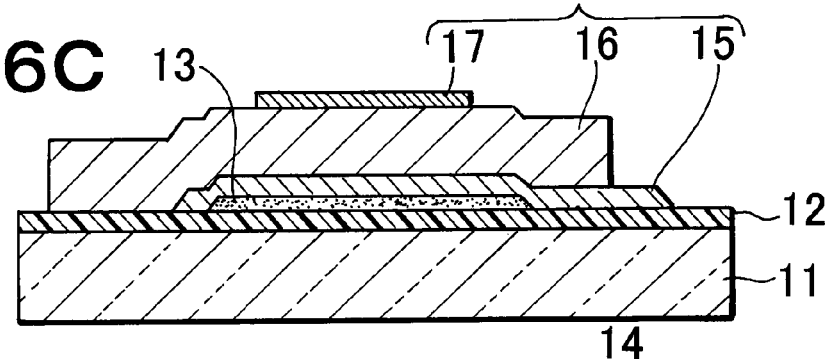
Figure 6D:
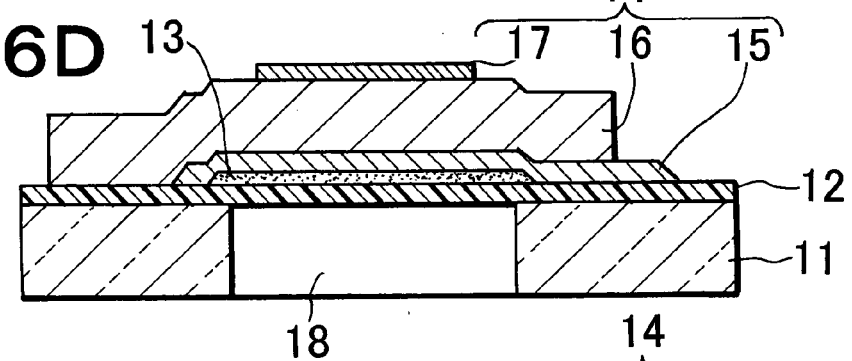
Figure 6E:
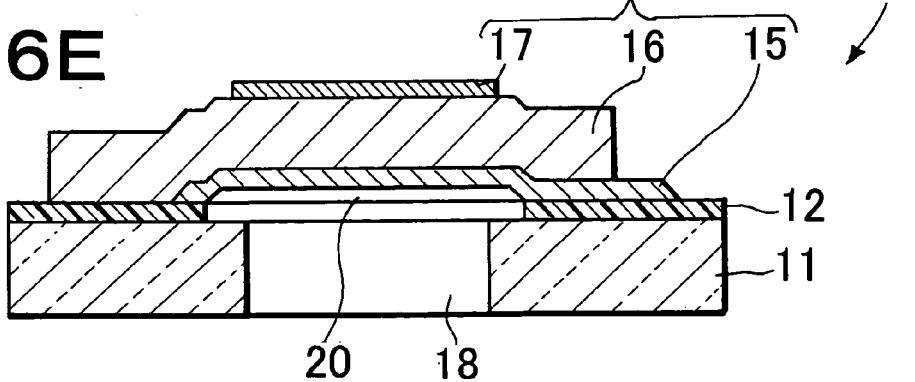

FIG. 4 is a schematic plan view showing a second embodiment of a piezoelectric thin film device according to the present invention, and FIG. 5 is a sectional view taken along a line X—X in FIG. 4. FIGS. 6A to 6E are explanatory views showing a series of producing process of the second embodiment in a sectional view of the line X—X similar to FIG. 5. In these drawings, members having similar functions as the members in FIG. 1 and FIG. 2 are designated by the same reference numerals.

In this embodiment, a via hole for exposing the sacrificial layer 13 or a part of the insulating layer 12 disposed under the sacrificial layer 13 is provided from the lower surface side of the substrate 11 to form a space 20 for oscillation. As a method for forming a via hole from the lower surface side of the substrate, a dry etching method using a sulfur hexafluoride ($SF_6$), etc., or a Deep RIE method which alternately uses an $SF_6$ and a flon C318 ($C_4F_8$) gas can be applied. In this embodiment, the via hole exposes only a part of the insulating layer 13. As compared with the first embodiment, since the via hole can be made large, the etching time for forming the space 20 for oscillation becomes shorter than the first embodiment. Further, when the etchant reaches the sacrificial layer 13, the sacrificial layer 13 is instantaneously etched, and hence the position of the space 20 for oscillation is substantially limited under the sacrificial layer 13 regardless of the shape of the via hole 18.

Figure 7:
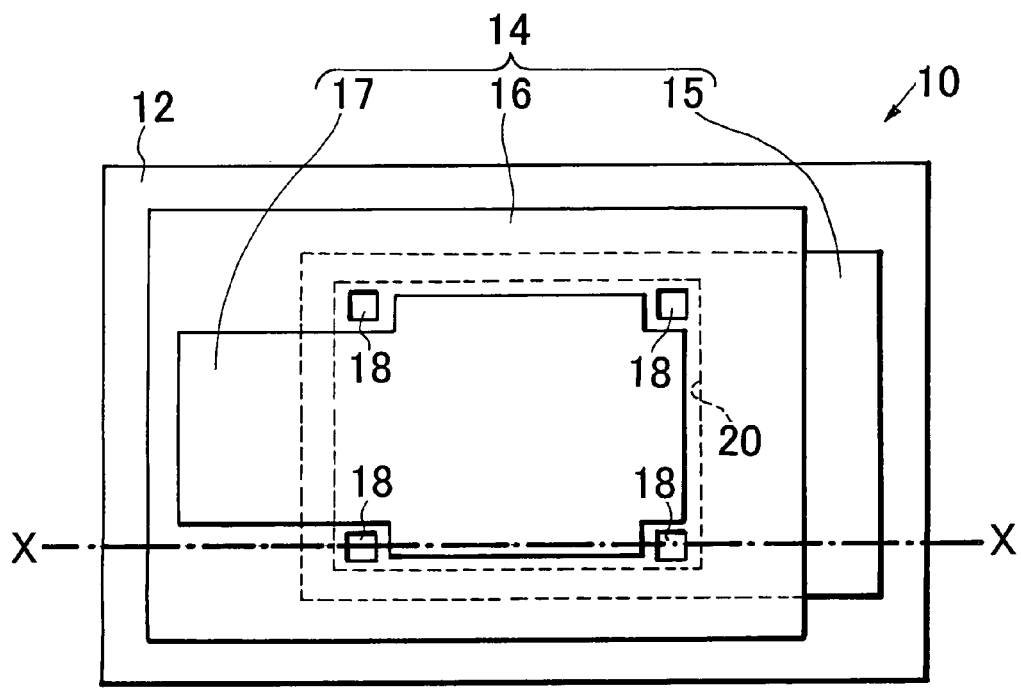
FIG. 7 is a schematic plan view showing still another embodiment of the piezoelectric thin film device (piezoelectric thin film resonator 10) according to the present invention.
Figure 8:
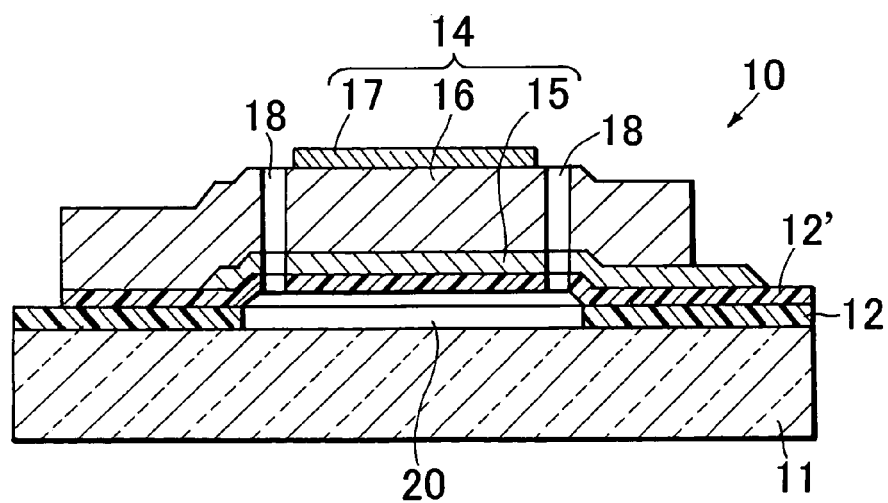
FIG. 8 is a sectional view taken along a line X—X of FIG. 7, wherein reference numeral 10 denotes a piezoelectric thin film device (piezoelectric thin film resonator), 11 a substrate, 12 an insulating layer, 12' a second insulating layer, 13 a sacrificial layer, 14 a piezoelectric laminated structure, 15 a lower electrode, 16 a piezoelectric thin film, 17 an upper electrode, 18 a via hole, and 20 denotes a space for oscillation.

FIG. 7 is a schematic plan view showing a third embodiment of a piezoelectric thin film device according to the present invention, and FIG. 8 is a sectional view taken along the line X—X of FIG. 7. In these drawings, the members having the similar functions as the members in FIG. 1 and FIG. 2 are designated by the same reference numerals.

In this embodiment, after the first insulating layer 12 is formed on the substrate 11, the sacrificial layer (similar to the sacrificial layer 13 of the above embodiment) having a higher etching rate by a certain chemical substance than the first insulating layer 12 on a region corresponding to the space 20 for oscillation on the first insulating layer 12. Then, in addition to the sacrificial layer and the first insulating layer 12, a second insulating layer 12' of material different from the first insulating layer 12 is laminated. A piezoelectric laminated structure 14 having a lower electrode 15, a piezoelectric thin film 16 and an upper electrode 17 is formed on this second insulating layer 12'. Then, a via hole 18 is provided to expose a part of the sacrificial layer 13 through the piezoelectric thin film 16, the lower electrode 15 and the second insulating layer 12', and an etchant for etching the sacrificial layer and the insulating layer is introduced through this via hole. Since the sacrificial layer is selected from the substance having a higher etching rate than the insulating layer 12, the sacrificial layer is firstly removed by the etching prior to removal of the insulating layer 12, and the etchant is introduced excellently into a gap formed by the etching. Although the etching itself is isotropic, the etchant is introduced in a planar manner to the gap where the sacrificial layer 13 is removed. Thus, the insulating layer 12 is etched mainly in the thickness direction, and the insulating layer 12 located below the sacrificial layer 13 is partially and excellently removed by etching. Since the etching is isotropic, the portion of the insulating layer 12 disposed corresponding to the end of the sacrificial layer 13 is also etched in the lateral direction. The amount of side etching is about the thickness of the insulating layer 13, and the space 20 for oscillation is limited substantially to the portion where the sacrificial layer is removed and the portion of the insulating layer 12 disposed thereunder. The space 20 for oscillation of a desired shape can be formed by selecting as the second insulating layer 12' an insulating material having a smaller etching rate by a specific chemical substance than the first insulating layer 12. Thus, in the present invention, the sacrificial layer and the insulating layer are etched by the same etchant (specific chemical substance).

As the material of the second insulating layer 12', a nitride or oxynitride insulator containing aluminum nitride or a silicon nitride as a main component can be used suitably.

As have been described with respect to the first, second and third embodiments, the insulating layer capable of being etched by a certain specific chemical substance and the sacrificial layer having a higher etching rate by the specific chemical substance than the insulating layer are combined. Thus, the insulating layer and the sacrificial layer can be removed by one etching operation without using a polishing technology such as a CMP, etc., and the space for oscillation can be formed excellently under the piezoelectric laminated structure by a simple process. Since a bend of the end of the piezoelectric laminated structure can be suppressed to a small extent, an occurrence of a crack on the piezoelectric thin film can be prevented. It is possible to produce a piezoelectric laminated structure having excellent characteristics and high reliability. Therefore, it is possible to stably produce a piezoelectric thin film device such as a filter, duplexer, or the like by combining a plurality of the piezoelectric laminated structures.

The piezoelectric thin film device produced as described above comprises the substrate, the insulating layer formed on the upper surface of the substrate, the space for oscillation formed on the insulating layer, and the piezoelectric laminated structure supported by the insulating layer and disposed on the space for oscillation. The piezoelectric laminated structure includes the piezoelectric thin film, and the electrodes formed on both surfaces of the piezoelectric thin film, and the space for oscillation is formed to allow the oscillation of the piezoelectric laminated structure. The upper surface of the insulating layer is disposed lower than the lower surface of the adjacent lower electrode in a region of the space for oscillation, and disposed above the lower surface of the space for oscillation. Here, when the RMS variation in height as the surface roughness of the lower surface of the lower electrode is 5 nm or less, the decrease of the electromechanical coupling factor $Kt^2$ in association with the decrease in the crystal orientation of the piezoelectric thin film itself, or a decrease in the resonant sharpness Q in association with the increase in a surface roughness of the piezoelectric laminated structure hardly occur, which is preferable.

Further, an interval between the upper surface of the insulating layer and the lower surface of the lower electrode in the area of the space for oscillation is preferably 20 nm to 600 nm, or preferably 20 nm to 90 nm. Preferably, the piezoelectric thin film device has an interval between the upper surface of the insulating layer and the lower surface of the space for oscillation of 500 nm to 3000 nm.

Since the piezoelectric thin film device of the present invention has the space for oscillation under the piezoelectric laminated structure with favorable shape and dimension, the characteristics thereof are excellent, and the reliability thereof is high.

EXAMPLE

Examples and comparative examples are shown below, and the present invention will be described in further detail.

Example 1

In this example, a piezoelectric thin film device (piezoelectric thin film resonator) constituted as shown in FIGS. 1 and 2 was produced as below.

That is, an $SiO_2$ layer having a thickness of 2000 nm was formed by a thermal oxidation method as an insulating layer, on both surfaces of a 6-inch Si wafer having a thickness of 625 μm. The upper surface of the Si wafer was coated with a photoresist, and a lift-off pattern for a sacrificial layer for forming a space for oscillation shown in FIG. 1 was formed. After a Ti layer of 50 nm was formed as a sacrificial layer on an upper surface side of this Si wafer by a DC magnetron sputtering method under the conditions of gas pressure of 0.5 Pa without heating a substrate, an ultrasonic wave was applied thereto in a resist removing liquid to pattern the sacrificial layer in a desired shape. Then, the upper surface of this Si wafer was coated with the photoresist. A lift-off pattern for a lower electrode as shown in FIG. 1 was formed, and an Mo layer of about 300 nm was formed as a lower electrode by a DC magnetron sputtering method under the conditions of a gas pressure of 0.5 Pa without heating the substrate. An ultrasonic wave was applied thereto in the resist removing liquid to pattern the lower electrode in a desired shape. Then, an Al target having a purity of 99.999% was used to form an AlN piezoelectric thin film having a thickness of about 1500 nm by a reactive magnetron sputtering method under the conditions of an entire gas pressure of 0.5 Pa, a gas composition of $Ar/N_2=1/1$ and a substrate temperature of 300° C. The AlN piezoelectric thin film was patterned in a predetermined shape shown in FIG. 1 by wet etching using a heated phosphoric acid. After the photoresist was applied, and the photoresist was patterned in a predetermined shape by using a photomask for the upper electrode, an Mo layer having a thickness of about 300 nm was formed as an upper electrode by a DC magnetron sputtering method. Further, an ultrasonic wave was applied thereto in the resist removing liquid, and the upper electrode was patterned in the shape as shown in FIG. 1. Subsequently, a via hole shown in FIG. 1 was formed by a dry etching method using a mixed gas of $Cl_2$ and Ar. By dipping the obtained structure into the hydrofluoric acid buffer solution without removing the photoresist, the sacrificial layer and the insulating layer located below the sacrificial layer were removed by etching. Then, the photoresist was removed by ashing in $O_2$ plasma to form a space for oscillation. With the above producing process, a piezoelectric thin film device (piezoelectric thin film resonator) was produced on the upper surface of the 6-inch Si wafer.

The electric characteristics of the piezoelectric thin film resonator formed in the 6-inch Si wafer were evaluated by using a network analyzer. A GSG microprober was brought into contact with an I/O terminal of the resonator.

The method for forming the insulating layer, the material and thickness of the insulating layer, the material and thickness of the sacrificial layer and electromechanical coupling factor $Kt^2$, resonant sharpness Q and defective fraction of the obtained piezoelectric thin film resonator in this example were as shown in Table 1, wherein $Kt^2$=6.4%, Q=1250, and the defective fraction was 0.1%. Here, the defective fraction was obtained by dividing the number of the piezoelectric thin film resonators not showing a normal resonance spectrum by the number of all the piezoelectric thin film resonators formed on the wafer. Mainly, this defect was caused by the generation of a crack at the end of the piezoelectric laminated structure, exfoliation of a part of the lower electrode in association with the increase in the etching quantity in the lateral direction of the insulating layer portion corresponding to the end of the sacrificial layer, and further a physical contact of a part of the piezoelectric laminated structure with the substrate.

Example 3

In this example, as described below, the piezoelectric thin film device (piezoelectric thin film resonator) constructed as shown in FIGS. 1 and 2 was produced. That is, except that the forming method of the insulating layer was CVD method and the thickness of the insulating layer was 3000 nm, the piezoelectric thin film resonator shown in FIGS. 1 and 2 was produced by a method similar to the method shown in Example 1.

The forming method of the insulating layer, the material and thickness of the insulating layer, the material and thickness of the sacrificial layer, and the electromechanical coupling factor Kt2, resonant sharpness Q and the defective fraction of the obtained piezoelectric thin film resonator in this example were as shown in Table 1, wherein $Kt^2$=6.5%, Q=1070 and the defective fraction was 0.3%.

TABLE 1

| | Device Structure | Insulating layer | | | Sacrificial layer | | | Electro-mechanical coupling factor $Kt^2$ (%) | Resonant sharpness Q (−) | Defective fraction (%) |
| | | Forming method | Material | Thickness (nm) | Material | Thickness (nm) | Surface roughness RMS (nm) | | | |
|---|---|---|---|---|---|---|---|---|---|---|
| Example 1 | FIG. 1, 2 | Thermal oxidation | SiO$_2$ | 2,000 | Ti | 50 | 0.65 | 6.4 | 1,250 | 0.1 |
| Example 2 | FIG. 1, 2 | Thermal oxidation | SiO$_2$ | 1,000 | Ti | 50 | 0.60 | 6.2 | 1,300 | 0.4 |
| Example 3 | FIG. 1, 2 | CVD | SiO$_2$ | 3,000 | Ti | 50 | 0.95 | 6.5 | 1,070 | 0.3 |
| Example 4 | FIG. 1, 2 | Thermal oxidation | SiO$_2$ | 500 | Ti | 50 | 0.50 | 6.2 | 1,360 | 2.5 |
| Example 5 | FIG. 1, 2 | Thermal oxidation | SiO$_2$ | 2,000 | Ti | 20 | 0.45 | 6.4 | 1,100 | 1.0 |
| Example 6 | FIG. 1, 2 | Thermal oxidation | SiO$_2$ | 2,000 | Ti | 90 | 0.95 | 6.4 | 1,310 | 0.4 |
| Example 7 | FIG. 1, 2 | Thermal oxidation | SiO$_2$ | 2,000 | Ti | 500 | 1.50 | 5.8 | 890 | 2.8 |
| Example 8 | FIG. 1, 2 | Thermal oxidation | SiO$_2$ | 2,000 | Ti | 600 | 2.50 | 5.6 | 800 | 4.5 |
| Example 9 | FIG. 1, 2 | CVD | PSG | 3,000 | Ti | 50 | 0.90 | 6.5 | 1,020 | 0.1 |
| Example 10 | FIG. 1, 2 | CVD | BPSG | 2,500 | Ti | 500 | 1.20 | 5.7 | 940 | 2.8 |
| Example 11 | FIG. 1, 2 | Sputtering | AlN | 1,500 | Al | 50 | 0.95 | 6.7 | 1,100 | 0.3 |
| Example 12 | FIG. 1, 2 | Sputtering | AlN | 1,500 | Al | 500 | 1.35 | 5.9 | 860 | 3.1 |
| Example 13 | FIG. 4, 5 | Thermal oxidation | SiO$_2$ | 500 | Ti | 50 | 0.55 | 6.2 | 1,350 | 0.3 |
| Example 14 | FIG. 4, 5 | Thermal oxidation | SiO$_2$ | 2,000 | Ti | 50 | 0.65 | 6.4 | 1,220 | 0.2 |
| Example 15 | FIG. 7, 8 | No. 1 Thermal oxidation | SiO$_2$ | 2,000 | Ti | 50 | 0.85 | 6.5 | 1,260 | 0.5 |
| | | No. 2 Sputtering | AlN | 300 | | | | | | |
| Comparative Example 1 | FIG. 1, 2 | Thermal oxidation | SiO$_2$ | 2,000 | Ti | 0 | — | — | — | — |

Example 2

In this example, as described below, the piezoelectric thin film device (piezoelectric thin film resonator) constructed as shown in FIGS. 1 and 2 was produced. That is, except that the thickness of the insulating layer was 1000 nm, the piezoelectric thin film resonator shown in FIGS. 1 and 2 was produced by a method similar to the method shown in Example 1.

The forming method of the insulating layer, the material and thickness of the insulating layer, the material and thickness of the sacrificial layer, and the electromechanical coupling factor Kt2, resonant sharpness Q and the defective fraction of the obtained piezoelectric thin film resonator in this example were as shown in Table 1, wherein $Kt^2$=6.2%, Q=1300 and the defective fraction was 0.4%.

Example 4

In this example, as described below, the piezoelectric thin film device (piezoelectric thin film resonator) constructed as shown in FIGS. 1 and 2 was produced. That is, except that the thickness of the insulating layer was 500 nm, the piezoelectric thin film resonator shown in FIGS. 1 and 2 was produced by a method similar to the method shown in Example 1.

The forming method of the insulating layer, the material and thickness of the insulating layer, the material and thickness of the sacrificial layer, and the electromechanical coupling factor Kt2, resonant sharpness Q and the defective fraction of the obtained piezoelectric thin film resonator in this example were as shown in Table 1, wherein $Kt^2=6.2\%$, Q=1360 and the defective fraction was 2.5%.

Example 5

In this example, as described below, the piezoelectric thin film device (piezoelectric thin film resonator) constructed as shown in FIGS. 1 and 2 was produced. That is, except that the thickness of the sacrificial layer was 20 nm, the piezoelectric thin film resonator shown in FIGS. 1 and 2 was produced by a method similar to the method shown in Example 1.

The forming method of the insulating layer, the material and thickness of the insulating layer, the material and thickness of the sacrificial layer, and the electromechanical coupling factor Kt2, resonant sharpness Q and the defective fraction of the obtained piezoelectric thin film resonator in this example were as shown in Table 1, wherein $Kt^2=6.4\%$, Q=1100 and the defective fraction was 1.0%.

Example 6

In this example, as described below, the piezoelectric thin film device (piezoelectric thin film resonator) constructed as shown in FIGS. 1 and 2 was produced. That is, except that the thickness of the sacrificial layer was 90 nm, the piezoelectric thin film resonator shown in FIGS. 1 and 2 was produced by a method similar to the method shown in Example 1.

The forming method of the insulating layer, the material and thickness of the insulating layer, the material and thickness of the sacrificial layer, and the electromechanical coupling factor Kt2, resonant sharpness Q and the defective fraction of the obtained piezoelectric thin film resonator in this example were as shown in Table 1, wherein $Kt^2=6.4\%$, Q=1310 and the defective fraction was 0.4%.

Example 7

In this example, as described below, the piezoelectric thin film device (piezoelectric thin film resonator) constructed as shown in FIGS. 1 and 2 was produced. That is, except that the thickness of the sacrificial layer was 500 nm, the piezoelectric thin film resonator shown in FIGS. 1 and 2 was produced by a method similar to the method shown in Example 1.

The forming method of the insulating layer, the material and thickness of the insulating layer, the material and thickness of the sacrificial layer, and the electromechanical coupling factor Kt2, resonant sharpness Q and the defective fraction of the obtained piezoelectric thin film resonator in this example were as shown in Table 1, wherein $Kt^2=5.8\%$, Q=890 and the defective fraction was 2.8%.

Example 8

In this example, as described below, the piezoelectric thin film device (piezoelectric thin film resonator) constructed as shown in FIGS. 1 and 2 was produced. That is, except that the thickness of the sacrificial layer was 600 nm, the piezoelectric thin film resonator shown in FIGS. 1 and 2 was produced by a method similar to the method shown in Example 1.

The forming method of the insulating layer, the material and thickness of the insulating layer, the material and thickness of the sacrificial layer, and the electromechanical coupling factor Kt2, resonant sharpness Q and the defective fraction of the obtained piezoelectric thin film resonator in this example were as shown in Table 1, wherein $Kt^2=5.6\%$, Q=800 and the defective fraction was 4.5%.

Example 9

In this example, as described below, the piezoelectric thin film device (piezoelectric thin film resonator) constructed as shown in FIGS. 1 and 2 was produced. That is, except that the forming method of the insulating layer was CVD method, the material of the insulating layer was PSG (phosphosilicate glass) and the thickness of the insulating layer was 3000 nm, the piezoelectric thin film resonator shown in FIGS. 1 and 2 was produced by a method similar to the method shown in Example 1.

The forming method of the insulating layer, the material and thickness of the insulating layer, the material and thickness of the sacrificial layer, and the electromechanical coupling factor Kt2, resonant sharpness Q and the defective fraction of the obtained piezoelectric thin film resonator in this example were as shown in Table 1, wherein $Kt^2=6.5\%$, Q=1020 and the defective fraction was 0.1%.

Example 10

In this example, as described below, the piezoelectric thin film device (piezoelectric thin film resonator) constructed as shown in FIGS. 1 and 2 was produced. That is, except that the forming method of the insulating layer was CVD method, the material of the insulating layer was BPSG (borophosphosilicate glass), the thickness of the insulating layer was 2500 nm and the thickness of the sacrificial layer was 500 nm, the piezoelectric thin film resonator shown in FIGS. 1 and 2 was produced by a method similar to the method shown in Example 1.

The forming method of the insulating layer, the material and thickness of the insulating layer, the material and thickness of the sacrificial layer, and the electromechanical coupling factor Kt2, resonant sharpness Q and the defective fraction of the obtained piezoelectric thin film resonator in this example were as shown in Table 1, wherein $Kt^2=6.5\%$, Q=1020 and the defective fraction was 0.1%.

Example 11

In this example, a piezoelectric thin film device (piezoelectric thin film resonator) constructed as shown in FIGS. 1 and 2 was produced as below.

That is, an AlN insulating layer having a thickness of 1500 nm was formed on an upper surface of a 6-inch Si wafer having a thickness of 625 μm by a DC magnetron sputtering method under the conditions of entire gas pressure of 0.5 Pa, gas composition of $Ar/N_2=1/1$ and a substrate temperature of 300° C. Then, the upper surface of the Si wafer was coated with photoresist to form lift-off pattern for the sacrificial layer as shown in FIG. 1. After an Al layer having a thickness of 50 nm was formed on an upper surface side of this Si wafer as a sacrificial layer by a DC magnetron sputtering method under the conditions of a gas pressure of 0.5 Pa without heating a substrate, an ultrasonic wave was applied thereto in a resist removing liquid to pattern the sacrificial layer in a desired shape. Then, the upper surface of the Si wafer was coated with a photoresist, a lift-off pattern for the lower electrode as shown in FIG. 1 was formed. An Mo layer having a thickness of about 300 nm was formed as a lower electrode by a DC magnetron sputtering method under the conditions of a gas pressure of 0.5 Pa without heating the substrate, and an ultrasonic wave was applied thereto in the resist removing liquid to pattern the lower electrode in a desired shape. Thereafter, the AlN piezoelectric thin film having a thickness of about 1500 nm was formed by a reactive magnetron sputtering method by using an Al target of purity of 99.999% under the conditions of total gas pressure of 0.5 Pa, gas composition of $Ar/N_2=1/1$ and a substrate temperature of 300° C. Then, the AlN piezoelectric thin film was patterned in a predetermined shape shown in FIG. 1 by wet etching using a heated phosphoric acid. After photoresist was applied, and the photoresist was patterned in a predetermined shape by using a photomask for the upper electrode, an Mo layer having a thickness of about 300 nm was formed as the upper electrode by a DC magnetron sputtering method. Further, an ultrasonic wave was applied thereto in a resist removing liquid, and the upper electrode was patterned in a shape as shown in FIG. 1. Then, a via hole as shown in FIG. 1 was formed by a dry etching method using a gas mixture of $Cl_2$ and Ar. Then, the sacrificial layer and the AlN insulating layer disposed under the sacrificial layer were removed by etching by dipping the obtained structure in a heated phosphoric acid without removing the photoeresist, and the photoresist was removed by ashing in an $O_2$ plasma to produce a space for oscillation. A piezoelectric thin film device (piezoelectric thin film resonator) was produced on an upper surface of 6-inch Si wafer by the above-mentioned producing process.

The forming method of the insulating layer, the material and thickness of the insulating layer, the material and thickness of the sacrificial layer, and electro-mechanical coupling factor $Kt^2$, resonant sharpness Q and a defective fraction of the obtained piezoelectric thin film resonator were as shown in Table 1, wherein $Kt^2=6.7\%$, Q=1100, and the defective fraction was 0.3%.

Example 12

In this example, as described below, the piezoelectric thin film device (piezoelectric thin film resonator) constructed as shown in FIGS. 1 and 2 was produced. That is, except that the thickness of the sacrificial layer was 500 nm, the piezoelectric thin film resonator shown in FIGS. 1 and 2 was produced by a method similar to the method shown in example 11.

The forming method of the insulating layer, the material and thickness of the insulating layer, the material and thickness of the sacrificial layer, and the electro-mechanical coupling factor Kt2, resonant sharpness Q and the defective fraction of the obtained piezoelectric thin film resonator in this example were as shown in Table 1, wherein $Kt^2=5.9\%$, Q=860 and the defective fraction was 3.1%.

Example 13

In this example, a piezoelectric thin film device (piezoelectric thin film resonator) constructed as shown in FIGS. 4 and 5 was manufactured as below.

That is, after a $SiO_2$ layer having a thickness of 500 nm was formed by a thermal oxidation method on both surfaces of a 6-inch Si wafer having a thickness of 300 μm, the upper surface of the Si wafer was coated with photoresist to form a lift-off pattern for a sacrificial layer for forming a space for oscillation as shown in FIG. 4. After a Ti layer of 50 nm was formed as the sacrificial layer on the upper surface side of the Si wafer by a DC magnetron sputtering method under the conditions of a gas pressure of 0.5 Pa without heating a substrate, an ultrasonic wave was applied thereto in a resist removing liquid to pattern the sacrificial layer in a desired shape. Then, the upper surface of the Si wafer was coated with photoresist, a lift-off pattern for a lower electrode as shown in FIG. 4 was formed. An Mo layer of about 300 nm was formed as a lower electrode by a DC magnetron sputtering method under the conditions of gas pressure of 0.5 Pa without heating a substrate, and an ultrasonic wave was applied thereto in a resist removing liquid to pattern the lower electrode in a desired shape. Then, an AlN piezoelectric thin film having a thickness of about 1500 nm was formed by a reactive magnetron sputtering method by using an Al target having purity of 99.999% under the conditions of total gas pressure of 0.5 Pa, gas composition of $Ar/N_2=1/1$ and a substrate temperature of 300° C. Then, the AlN piezoelectric thin film was patterned in a predetermined shape shown in FIG. 4 by wet etching using a heated phosphoric acid. After the photoresist was applied, and the photoresist was patterned in a predetermined shape, an Mo layer having a thickness of about 300 nm was formed as an upper electrode by a DC magnetron sputtering method. Further, an ultrasonic wave was applied thereto in a resist removing liquid, and the upper electrode was patterned in a shape as shown in FIG. 4. Then, both the surfaces of the wafer were coated with photoresist, and a pattern for forming a via hole as shown in FIG. 4 was formed at a lower surface side of the wafer. The thermal oxide film on the lower surface side of the wafer was patterned by dipping the obtained structure in a hydrofluoric acid buffer solution. Further, the Si wafer was etched by a Deep RIE method alternately using $SF_6$ and $C_4F_8$ gas until the insulating layer (thermal oxide film) formed on the upper surface side of the wafer was exposed. By dipping the obtained structure into the hydrofluoric acid buffer solution without removing the photoresist, the sacrificial layer and the insulating layer located below the sacrificial layer were removed by etching. Then, the photoresist on the both surfaces of the wafer was removed by ashing in $O_2$ plasma to form a space for oscillation. The piezoelectlric thin film device (piezoelectric thin film resonator) was produced on the upper surface of the 6-inch Si wafer by the above-mentioned producing process.

The forming method of the insulating layer, the material and thickness of the insulating layer, the material and thickness of the sacrificial layer, and electromechanical coupling factor $Kt^2$, resonant sharpness Q and a defective fraction of the obtained piezoelectric thin film resonator were as shown in Table 1, wherein $Kt^2=6.2\%$, Q=1350, and the defective fraction is 0.3%.

Example 14

In this example, a piezoelectric thin film device (piezoelectric thin film resonator) constructed as shown in FIGS. 4 and 5 was manufactured as below. That is, except that the thickness of the insulating layer was 2000 nm, the piezoelectric thin film resonator shown in FIGS. 4 and 5 was produced by a method similar to the method shown in example 13.

The forming method of the insulating layer, the material and thickness of the insulating layer, the material and thickness of the sacrificial layer, and the electromechanical coupling factor $Kt^2$, resonant sharpness Q and the defective fraction of the obtained piezoelectric thin film resonator in this example were as shown in Table 1, wherein $Kt^2=6.4\%$, Q=1220 and the defective fraction was 0.2%.

Example 15

In this example, a piezoelectric thin film device (piezoelectric thin film resonator) constructed as shown in FIGS. 7 and 8 was manufactured as below.

That is, after an $SiO_2$ layer having a thickness of 2000 nm was formed by a thermal oxidation method as an insulating layer on both surfaces of a 6-inch Si wafer having a thickness of 625 µm, an upper surface of the Si wafer was coated with a photoresist, and a lift-off pattern for a sacrificial layer shown in FIG. 7 was formed. After a Ti layer of 50 nm was formed as a sacrificial layer on the upper surface side of this Si wafer by a DC magnetron sputtering method under the conditions of gas pressure of 0.5 Pa without heating a substrate, an ultrasonic wave was applied thereto in a resist removing liquid to pattern the sacrificial layer in a desired shape. Then, an AlN second insulating layer having a thickness of 300 nm was formed on the upper surface of the 6-inch Si wafer having a thickness of 625 µm by the DC magnetron sputtering method under the conditions of entire gas pressure of 0.5 Pa, gas composition of $Ar/N_2=1/1$ and a substrate temperature of 300° C. Further, the upper surface of this AlN second insulating layer was coated with photoresist, and a lift-off pattern for a lower electrode as shown in FIG. 7 was formed. An Mo layer of about 300 nm was formed as a lower electrode by a DC magnetron sputtering method under the conditions of a gas pressure of 0.5 Pa without heating the substrate, and the lower electrode was patterned in a desired shape by applying an ultrasonic wave in the resist removing liquid. After the lower electrode pattern was formed, an Al target of purity of 99.999% was used to form an AlN piezoelectric thin film having a thickness of about 1500 nm by a reactive magnetron sputtering method under the conditions of the entire gas pressure of 0.5 Pa, gas composition of $Ar/N_2=1/1$ and a substrate temperature of 300° C. Subsequently, the AlN piezoelectric thin film was patterned in a predetermined shape shown in FIG. 7 by wet etching using a heated phosphoric acid. After the photoresist was applied, and the photoresist was patterned in a predetermined shape by using a photomask for the upper electrode, an Mo layer having a thickness of about 300 nm was formed as the upper electrode by a DC magnetron sputtering method. The upper electrode was patterned in a shape shown in FIG. 7 by applying an ultrasonic wave in the resist removing liquid. Thereafter, a via hole shown in FIG. 7 was formed by a dry etching method using a mixture gas of $Cl_2$ and Ar. By dipping the obtained structure into the hydrofluoric acid buffer solution without removing the photoresist, the sacrificial layer and the $SiO_2$ insulating layer located below the sacrificial layer were removed by etching. Then, the photoresist was removed by ashing in $O_2$ plasma to form a space for oscillation. The piezoelectric thin film device (piezoelectric thin film resonator) was produced on the upper surface of the 6-inch Si wafer by the above-mentioned producing process.

The forming method of the insulating layer, the material and thickness of the insulating layer, the material and thickness of the sacrificial layer, and the electromechanical coupling factor Kt2, resonant sharpness Q and the defective fraction of the obtained piezoelectric thin film resonator in this example were as shown in Table 1, wherein $Kt^2=6.5\%$, $Q=1260$ and the defective fraction was 0.5%.

Comparative Example 1

In this comparative example, it was tried that, as described below, the piezoelectric thin film device (piezoelectric thin film resonator) constructed as shown in FIGS. 1 and 2 was produced. That is, except that no sacrificial layer was formed, the piezoelectric thin film resonator shown in FIGS. 1 and 2 was produced by a method similar to the method shown in Example 1. However, although the etching treatment was conducted during a long time, there could not be formed the space for oscillation under the piezoelectric laminated structure. Therefore no electric characteristics of the device could be evaluated.

The invention claimed is:

1. A method of producing a piezoelectric thin film device in which a piezoelectric laminated structure including a piezoelectric thin film, an upper electrode and a lower electrode formed on the upper and lower surfaces of the film, respectively, is supported by a substrate, and in which a space for oscillation is formed to allow the oscillation of the piezoelectric laminated structure, comprising:
    a step of forming an insulating layer capable of being etched by a specific chemical substance on the upper surface of the substrate;
    a step of forming a sacrificial layer made of a substance having a higher etching rate by the specific chemical substance than the insulating layer on a partial region of the insulating layer;
    a step of forming a lower electrode on a region including a part or entirety of the sacrificial layer;
    a step of forming the piezoelectric thin film on a region including a part of the lower electrode;
    a step of forming an upper electrode on a region including a part of the piezoelectric thin film;
    a step of forming via hole so as to expose a part of the sacrificial layer or a part of the insulating layer provided under the sacrificial layer; and
    a step of forming the space for oscillation by etching both the sacrificial layer and the insulating layer provided under the sacrificial layer with the same specific chemical substance by introducing the specific chemical substance through the via hole.

2. The method of producing a piezoelectric thin film device as claimed in claim 1, wherein the via hole is formed to penetrate at least one of the lower electrode, the piezoelectric thin film and the upper electrode to expose a part of the sacrificial layer.

3. The method of producing a piezoelectric thin film device as claimed in claim 1, wherein the via hole is formed to penetrate the substrate to expose a portion of the insulating layer.

4. The method of producing a piezoelectric thin film device as claimed in claim 1, wherein material of the insulating layer contains a silica glass or a silicate glass as a main component, and material of the sacrificial layer is titanium.

5. The method of producing a piezoelectric thin film device as claimed in claim 1, wherein the material of the insulating layer is aluminum nitride, and material of the sacrificial layer is aluminum.

6. The method of producing a piezoelectric thin film device as claimed in claim 1, further comprising a step of, after forming the sacrificial layer, laminating a second insulating layer made of a substance having a smaller etching rate by the specific chemical substance than the insulating layer on the sacrificial layer and the insulating layer.

7. The method of producing a piezoelectric thin film device as claimed in claim 6, wherein material of the second insulating layer is a nitride or oxynitride insulator containing aluminum nitride or silicon nitride as a main component.

8. The method of producing a piezoelectric thin film device as claimed in claim 1, wherein a thickness of the sacrificial layer is 20 nm to 600 nm.

9. The method of producing a piezoelectric thin film device as claimed in claim 1, wherein a thickness of the sacrificial layer is 20 nm to 90 nm.

10. The method of producing a piezoelectric thin film device as claimed in claim 1, wherein a surface roughness of the upper surface of the sacrificial layer is 5 nm or less by RMS variation in height.

11. The method of producing a piezoelectric thin film device as claimed in claim 1, wherein a thickness of the insulating layer is 500 nm to 3000 nm.

12. A piezoelectric thin film device in which a piezoelectric laminated structure including a piezoelectric thin film, an upper electrode and a lower electrode formed on the upper and lower surfaces of the film, respectively, is supported by a substrate via an insulating layer, and in which a space for oscillation is formed to allow the oscillation of the piezoelectric laminated structure, characterized in that a surface roughness of a lower surface of the lower electrode is 5 nm or less by RMS variation in height, and an upper surface of the insulating layer is disposed lower than the lower surface of the lower electrode in the space for oscillation and positioned above a lower surface of the space for oscillation.

13. The piezoelectric thin film device as claimed in claim 12, wherein an interval between the upper surface of the insulating layer and the lower surface of the lower electrode in the space for oscillation is 20 nm to 600 nm.

14. The piezoelectric thin film device as claimed in claim 12, wherein an interval between the upper surface of the insulating layer and the lower surface of the lower electrode in the space for oscillation is 20 nm to 90 nm.

15. The piezoelectric thin film device as claimed in claim 12, an interval between the upper surface of the insulating layer and the lower surface of the space for oscillation is 500 nm to 3000 nm.

* * * * *